United States Patent [19]

Hahn

[11] Patent Number: 4,990,233

[45] Date of Patent: Feb. 5, 1991

[54] METHOD FOR RETARDING MINERAL BUILDUP IN DOWNHOLE PUMPS

[75] Inventor: Granville Hahn, Big Spring, Tex.

[73] Assignee: Permian Research Corporation, Big Spring, Tex.

[21] Appl. No.: 745,322

[22] Filed: Jun. 14, 1985

[51] Int. Cl.$^5$ .......................... C23C 14/48; B05D 3/06
[52] U.S. Cl. .................. 204/192.31; 427/38; 427/39
[58] Field of Search .............. 137/329.3, 375, 539; 204/192 N, 192 R, 298, 192.31, 298.05; 148/4, 320, 900; 427/38, 39

[56] References Cited

U.S. PATENT DOCUMENTS

| | | | |
|---|---|---|---|
| 2,970,606 | 2/1961 | Williams | 137/329.3 |
| 3,925,116 | 12/1975 | Engel | 204/192 N |
| 4,401,719 | 8/1983 | Kobayashi et al. | 204/192.31 |
| 4,420,386 | 12/1983 | White | 204/192 N |
| 4,486,247 | 12/1984 | Ecer et al. | 204/192 N |
| 4,507,189 | 3/1985 | Dol et al. | 204/192 N |

FOREIGN PATENT DOCUMENTS 1413813 12/1975 United Kingdom ............ 204/192 N

OTHER PUBLICATIONS

Dugdale et al., "Sputter ion plating", Welding Institute Reprint, Advanced In Surface Coating Technol., London, Feb. 13-15, 1978; pp. 53-60.
Dearnaley II, Thin Solid Films 107(1983), pp. 315-326; Sioshansi Thin Solid Films 118(1984), pp. 61-71.
Ohmae(I) Proc. 6th Intern. Vac. Cong. 1974; J. App. Phys. Supp. 2, Part I, 1974, pp. 451-454; Ohmae(II), J. Vac. Sci. Technol. 13 (1976); pp. 82-87.
Tsunasawa et al., J. Vac. Sci. Technol. 14 (1977), pp. 651-654; Eylon et al., Thin Solid Films 73 (1980), pp. 323-329.
Ohmae(III), Wear 30 (1974) pp. 299-309, Carlson et al.; IBM Tech. Disc. Bull. 22 (1979), pp. 3117-3118.

Primary Examiner—Nam X. Nguyen
Attorney, Agent, or Firm—Ross, Howison, Clapp & Korn

[57] ABSTRACT

A method for retarding non-corrosive mineral build-up and plugging in check valves utilized with downhole reciprocating rod pumps, comprising ion implanting or ion plating the interior facing metal surfaces of the check valve with a nonferrous metal or metal oxide.

6 Claims, 1 Drawing Sheet

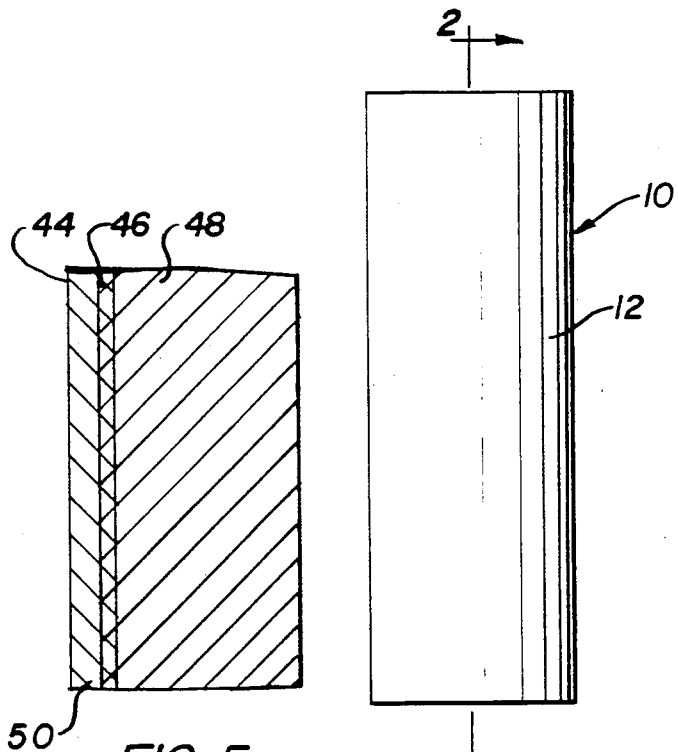
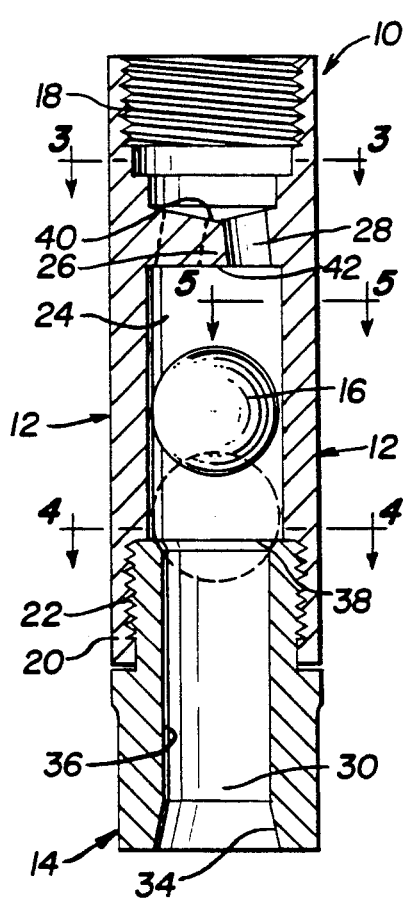
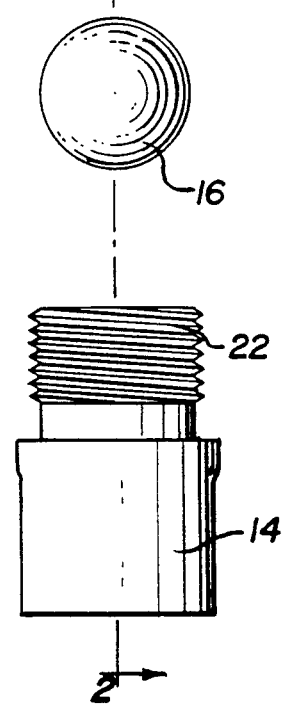
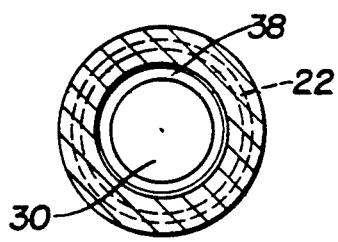
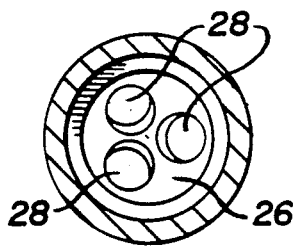

METHOD FOR RETARDING MINERAL BUILDUP IN DOWNHOLE PUMPS

This invention relates to downhole oilfield pumping equipment, and more particularly, to an apparatus and method for retarding mineral buildup and plugging in such equipment. One aspect of the invention relates to an improved check valve adapted for use with downhole reciprocating rod pumps. Another aspect of the invention relates to a method for retarding mineral buildup and plugging in check valves utilized with downhole reciprocating rod pumps.

A conventional method for producing oil from subterranean wells is by the use of surface-mounted pumpjacks that are connected to downhole mechanical rod pumps by strings of sucker rod. The entire string of sucker rod, which extends downward from the surface to the producing formation, is reciprocated several times per minute by the pumpjack, which is in turn driven by a motor. Check valves disposed at the bottom of these downhole mechanical rod pumps permit oil to flow upward into the pump from the well bore during the pumping stroke and then seal off to prevent the oil from flowing back into the well bore as the pump reciprocates.

Check valves commonly utilized at the base of these downhole reciprocating rod pumps comprise two threadedly engaged cylindrical portions that confine a "free-floating" stainless steel ball. The ball permits the pumped fluids to be drawn upward through the valve, but seats against a shoulder to prevent fluid flow when pumping stops or when the direction of flow is reversed. Such valves typically contain several smaller orifices within the main bore of the valve that are disposed above the ball and assist in maintaining a substantially even distribution of fluid flow around the ball.

It is well known that crude oil is produced from subterranean formations together with ground water that can contain a variety of dissolved minerals and other insoluble particulate matter. Unfortunately, it has been found that these minerals and other particulate matter can cause the smaller orifices in check valves utilized in downhole reciprocating rod pumps to plug off. In some cases the mineral buildup causes the main axial bore of the check valve to plug off below the ball.

In those wells where plugging problems occur, production rates fall off and eventually cease as plugging progresses. When production ceases, or else falls below a predetermined rate, it is necessary to bring in a workover rig to pull the string and pump from the hole for replacing the check valve. Although the cost of the valve itself is relatively small, the associated maintenance and lost production costs are very high. These costs are directly proportional to the frequency with which the production string must be pulled from the well and are inversely proportional to the number of days that the well can be successfully pumped without plugging An apparatus and method that will retard the rate of plugging in check valves of downhole reciprocating rod pumps are therefore needed.

According to the present invention, an apparatus and method are provided for retarding mineral formation, buildup and plugging in check valves utilized with downhole reciprocating rod pumps. According to a preferred embodiment of the invention, check valves are provided that comprise interior surfaces coated with ions of metals or metal oxides that are dissimilar to the metal of the valve substrate.

According to another embodiment of the invention, check valves for use with downhole reciprocating rod pumps are provided that comprise interior surfaces having metals or metal oxides that are dissimilar to the metal of the valve substrate deposited thereon by ion plating.

According to another embodiment of the invention, check valves for use with downhole reciprocating rod pumps are provided that comprise interior surface layers formed by implanting ions of dissimilar metals or of oxides of dissimilar metals thereon.

According to another embodiment of the invention, check valves adapted for use with downhole reciprocating rod pumps are provided that are coated with dissimilar materials selected from the group consisting of palladium, titanium, titanium oxide and magnesium.

According to another embodiment of the invention, a method for retarding mineral formation and resultant plugging in check valves utilized with downhole reciprocating rod pumps in oil wells is provided. The subject method preferably comprises the steps of applying a layer of dissimilar metal or metal oxide to the interior surfaces of a floating ball-type check valve, and thereafter deploying said check valve at the inlet side of a reciprocating rod pump in a producing zone of an oil well. According to a particularly preferred embodiment of the invention, dissimilar metals or metal oxides are applied to the interior surfaces of the check valve by ion plating or ion implantation.

According to another embodiment of the invention, a method is provided for manufacturing a floating ball-type check valve adapted to retard mineral formation or plugging when utilized in combination with a downhole reciprocating rod pump. The method comprises the steps of disassembling the check valve to remove the steel ball contained therein, thoroughly cleaning the nonthreaded interior surfaces of the disassembled parts (excluding the ball) of the check valve, placing the cleaned disassembled parts on a rotating work table in a space adapted to have the atmosphere evacuated therefrom, ion plating or ion implanting a dissimilar metal or metal oxide onto the interior surfaces of the disassembled parts of the check valve and thereafter reassembling the disassembled parts of the check valve with the stainless steel ball disposed therebetween.

The invention is further described and explained in relation to the following drawings in which:

FIG. 1 depicts an exploded elevation view of a disassembled floating ball-type check valve suitable for use with a downhole reciprocating rod pump;

FIG. 2 depicts a sectional elevation view along line 2—2 of the check valve of FIG. 1, but in assembled form;

FIG. 3 depicts a sectional plan view of the check valve of FIG. 1 as viewed along line 3—3 of FIG. 2;

FIG. 4 depicts a sectional plan view of the check valve of FIG. 1 as viewed along line 4—4 of FIG. 2; and FIG. 5 depicts a simplified, illustrative detail view of a wall section taken along line 5—5 of FIG. 2.

Like numerals are used to indicate like parts in all figures of the drawings.

FIG. 1 depicts a disassembled check valve of the type commonly utilized at the inlet side of downhole reciprocating rod pumps. This valve employs a steel ball which is raised off its seat by fluid passing upward through the valve, but which blocks flow when the flow direction is reversed. Referring to FIG. 1, check valve 10 comprises body portion 12, valve seat portion 14 and ball 16. Check valves of this type are manufactured, for example, by Harbison/Fisher of 4140 metal (iron). The internal structure of check valve 10 is further described in relation to FIGS. 2-4 of the drawings.

Valve body 12 further comprises upper and lower threaded sleeve portions 18, 20, respectively. Upper sleeve portion 18 is adapted to threadedly engage a downward extending threaded member on the inlet side of a downhole reciprocating rod pump. Lower end portion 20 is adapted to threadedly engage the upwardly extending male threads 22 of valve seat portion 14. Fluid communication is provided between upper and lower sleeve portions 18, 20 through centrally disposed axial bore 24. Spider 26 bridges axial bore 24 and contains a plurality of spaced orifices 28 adapted to provide fluid communication through spider 26. Spider 26 is believed to assist in providing a uniform flow distribution around ball 16 when fluid is flowing upward through axial bore 24 of check valve 10.

Valve seat portion 14 comprises axial bore 30 adapted to provide fluid communication between inlet port 32 and axial bore 24 of valve body 10. In the inlet zone of valve seat portion 14, interior walls 34 are slightly tapered to assist in directing the fluid flow into axial bore 30. Above the taper, interior walls 36 of axial bore 30 are cylindrical, and have a diameter that is stepped in from the diameter of axial bore 24 of valve body 12. Shoulder 38 of valve seat portion 14 is beveled slightly to form a seat for ball 16.

Ball 16 is preferably a steel ball of the type conventionally employed in such valves. The diameter of ball 16 should be less than the diameter of axial bore 24 through valve body 12, but greater than the diameter of axial bore 30 of valve seat portion 14 at shoulder 38. When fluid is flowing upward through check valve 10 during the suction stroke of the pumping operation, ball 16 will rise from shoulder 38 and fluid will flow around ball 16 and through orifices 28. Once the upwardly directed fluid flow ceases, ball 16 settles back down onto shoulder 38, preventing fluid above that point from flowing downwardly through axial bore 24 of valve body 12.

When check valves 10 are utilized in the field, particularly in wells where the water produced with the oil has a high mineral content, mineral buildup and resultant plugging is experienced across orifices 28 and across inlet port 32. Applicant has now discovered that the rate of mineral buildup and plugging within orifices 28 and inlet port 32 can be significantly retarded by applying a dissimilar metal to the interior surfaces of axial bores 24, 30, to the interior surfaces of orifices 28, and to the top and bottom faces 40, 42 of spider 26 by ion implantation. Preferred dissimilar metals that are believed to be satisfactory for use with the present invention include palladium, titanium, titanium oxide and magnesium. Oxides of the above mentioned metals are also believed to be satisfactory for use in accordance with the present invention. These oxides can either be applied to the interior surfaces of check valves 10 as disclosed herein or can be applied as a pure metal and can then be subsequently oxidized by exposure to air or another oxygen containing gas. Throughout the specification, the term "dissimilar" is intended to be limited to nonferrous metals and metal oxides. It is further understood that ion implantation techniques can cause surface alloying between the nonferrous implanted metal and the ferrous substrate metal. Thus, the resultant surface alloy may have a minor ferrous component. For purposes of this invention, where the characteristics of the nonferrous component of the surface alloy predominate at the interior facing surface of the ferrous substrate, the resultant valve is considered to be within the scope of this invention.

Also, while ion implantation is the preferred method for applying nonferrous metals to the interior surfaces of check valves, it is believed that other metal deposition techniques such as ion plating, for example, can also be used satisfactorily within the scope of the invention. With such other methods, however, the nonferrous metal layer may be more subject to wear or abrasion, and may need to be thicker than for ion implantation.

The improved check valve of the invention is preferably made by applying dissimilar metals or oxides of dissimilar metals to interior surfaces check valve 10 through ion implantation or ion plating. With ion implantation, the thickness implanted region is typically less than 1,000 angstroms for implantation energies of 100 keV. As previously stated, ion implantation causes the formation of a surface alloy of graded composition that possesses no well-defined interface with respect to the substrate as does a deposited layer. In ion plating, however, the coating is typically thicker, and its composition is independent of the nature of the substrate. Although ion plating is often carried out with the substrates electrically biased at several kilovolts, the mean energy of the particles reaching the surface is probably the order of only 100 eV or so. In addition, only a small fraction of the particles are ionized when they reach the substrate. Ion plating is carried out under vacuum, which facilitates an increase in particle speed that is needed for adhesion to the substrate. The resultant collisions and scattering between particles are also responsible for the "throwing power" of the ion-plating technique versus the "line-of-sight" limitation of implantation. A more thorough discussion of the methods and apparatus needed to perform ion implantation and ion plating are contained in the following references, the full texts of which are incorporated by reference herein and made a part hereof: U.S. Pat. No. 3,329,601; U.S. Pat. No. 4,039,416; U.S. Pat. No. Re. 30,401; and U.S. Pat. No. 4,420,386; D. M. Mattox, "Fundamentals of Ion Plating," *J. Vac. Sci. Technol.*, vol 10, pp. 46-52 (1973); L Leder, "Fundamental Parameters of Ion Plating," *Metal Finishing*, pp. 41-45 (1974); Berry et al., "Thin Film Technology," Van Nostrand Reinhold, N.Y., pp. 156-157, 142-144 (1968); S. Aisenberg et al., "Physics of Ion Plating & Ion Beam Deposition," *J. Vac. Sci. Technol.*, vol. 10, pp. 104-107 (1973); "A Study of Vacuum Deposition Techniques," White, Gerald W., *Appliance Engineer*, April 1981, 51-54; and *Ion Implantation Metallurgy*, Metallurgical Society of AIME, 420 Commonwealth Dr., Warrendale, Pa.

An illustrative cross-section through the wall of valve body 12 is depicted in FIG. 5. FIG. 5 is provided for ease of illustration to show the dissimilar metal layer that is preferably applied to the entirety of the interior-facing surfaces of check valve 10 within the scope of the present invention. Being very thin relative to the wall thickness of check valve 10, layers 44 and 46 are not visible in FIGS. 2, 3 and 4. Referring to FIG. 5, layer 50 of nonferrous metal or metal oxide preferably selected from the group consisting of palladium, titanium, titanium oxide and magnesium is ion implanted on the interior of wall 48 of check valve 10. Layer 46 comprises an alloyed layer of the nonferrous ion implanted metal with the ferrous substrate metal. Surface 44 of layer 50 thus becomes the interior-facing surface of wall 48 of check valve 10 following ion implantation.

The method of the invention in which the subject check valves are utilized for retarding mineral buildup and plugging in downhole oil field pumping equipment is further described and explained by reference to the following examples:

EXAMPLE 1

A west Texas oil well identified as Hildebrand 40-12 had a five-year history during which it had been necessary to bring in a workover rig and pull the pump and production tubing from the well every 25 to 30 days due to plugging problems. Each time the pump was removed from the well, it was discovered that flow through the check valve at the inlet side of the pump was severely retarded by mineral buildup on the interior facing surfaces of the check valve. This mineral buildup occurred quickly enough to reduce production in the well by 50% every 25 to 30 days, at which time the valve was changed and full production was restored.

An analysis of the water being produced with the crude oil from the Hildebrand 40-12 well revealed the following mineral content:

| Compound | Mg/L |
| --- | --- |
| $Ca(HCO_3)_2$ | 2431 |
| $CaCl_2$ | 8562 |
| $MgCl_2$ | 3142 |
| NaCl | 102363 |

In accordance with the method of the present invention, a conventional, commercially available Harbison/Fisher (4140) valve was disassembled and thoroughly cleaned, first by soaking in a heated organic solvent, and then by blasting with glass microbeads. Another useful method for cleaning the substrate metal is by using acetone in combination with an ultrasonic bath. After cleaning, the disassembled valve body portion and valve seat portion of the check valve were placed on a work table, and a thin layer of palladium was applied to the interior facing surfaces of the valve parts by known ion implantation techniques as referred to above. The following ion implantation, the valve parts were reassembled together with a ball to make a working valve. The valve was then used to replace a plugged valve and was deployed downhole at the inlet side of the reciprocating rod pump in the subject well. The pump was then placed in service and production continued for 59 days, more than twice the service life previously experienced, before production was retarded by 50%.

EXAMPLE 2

Another check valve was disassembled, cleaned, ion, reassembled and deployed in the Hildebrand 40-12 well as described above, except that the ion implantation was done with titanium oxide instead of palladium. Even though production had not fallen off after 28 days in the manner that had previously been experienced with check valves lacking the ion implanted layer of nonferrous metal, the pump was pulled to inspect the condition of the valve. No buildup of mineral deposits on the interior facing surfaces of the valve were observed.

EXAMPLE 3

Another check valve was disassembled, cleaned, ion implanted, reassembled and deployed in the Hildebrand 40-12 well as described above, except that the ion implantation was done with magnesium. The pump was then placed in service and production continued for 34 days.

From the foregoing examples, it is seen that the service life of check valves employed at the inlet side of downhole reciprocating rod pumps is improved through use of the apparatus and methods disclosed herein. An ion implanted layer of certain nonferrous metals on the interior facing surfaces of the check valves has proved to be effective for retarding mineral buildup and plugging in such equipment. Although the mechanism by which this phenomenon is achieved is not fully understood or appreciated at the present time, it may well be attributable to the electrochemical characteristics of the minerals in the water relative to the ion implanted or ion plated nonferrous layer versus the ferrous substrate with which the minerals in the water would otherwise contact.

Although the invention is described herein in relation to its preferred embodiments, it is understood and appreciated that other alterations or embodiments may become obvious to those of ordinary skill in the art upon reading the instant disclosure, and it is intended that the invention be limited only by the appended claims.

What is claimed is:

1. A method for retarding non-corrosive mineral plugging in a check valve utilized in a downhole reciprocating rod pump, said check valve being characterized by a threaded valve body and a valve seat said method comprising ion implanting a layer of material selected from the group consisting of nonferrous metals or nonferrous metal oxides on the interior facing surfaces of the valve body and the valve seat.

2. The method of claim 1 wherein said nonferrous metals are selected from the group consisting of palladium, titanium and magnesium.

3. The method of claim 1 wherein said nonferrous metal oxide is titanium oxide.

4. A method for retarding non-corrosive mineral plugging in a check valve utilized in a downhole reciprocating rod pump, said check valve being characterized by a threaded valve body and a valve seat said method comprising ion plating a layer of material selected from the group consisting of nonferrous metals or nonferrous metal oxides on the interior facing surfaces of the valve body and the valve seat.

5. The method of claim 4 wherein said nonferrous metals are selected from the group consisting of palladium, titanium and magnesium.

6. The method of claim 4 wherein said nonferrous metal oxide is titanium oxide.

* * * * *

UNITED STATES PATENT AND TRADEMARK OFFICE
CERTIFICATE OF CORRECTION

PATENT NO. : 4,990,233

DATED : FEBRUARY 5, 1991

INVENTOR(S) : GRANVILLE HAHN

It is certified that error appears in the above-identified patent and that said Letters Patent is hereby corrected as shown below:

Column 1, Line 60:
   After plugging, insert --.--

Column 4, Line 19:
   After surfaces, insert --of--

Column 4, Line 21:
   After thickness, insert --of the--

Signed and Sealed this

Twenty-first Day of July, 1992

*Attest:*

DOUGLAS B. COMER

*Attesting Officer*     *Acting Commissioner of Patents and Trademarks*